United States Patent
Wu et al.

(10) Patent No.: US 9,673,074 B2
(45) Date of Patent: Jun. 6, 2017

(54) IN-SITU TEMPERATURE MEASUREMENT IN A NOISY ENVIRONMENT

(71) Applicant: Applied Materials, Inc., Santa Clara, CA (US)

(72) Inventors: Hanbing Wu, Millbrae, CA (US); Anantha K. Subramani, San Jose, CA (US); Wei W. Wang, Santa Clara, CA (US); Aaron Muir Hunter, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 434 days.

(21) Appl. No.: 14/189,664

(22) Filed: Feb. 25, 2014

(65) Prior Publication Data

US 2014/0269826 A1    Sep. 18, 2014

Related U.S. Application Data

(60) Provisional application No. 61/789,185, filed on Mar. 15, 2013.

(51) Int. Cl.
*H01L 21/67* (2006.01)
*H01L 21/687* (2006.01)
(Continued)

(52) U.S. Cl.
CPC ...... *H01L 21/67248* (2013.01); *G01J 5/0007* (2013.01); *G01J 5/0818* (2013.01); *H01L 21/68742* (2013.01)

(58) Field of Classification Search
CPC ......... H01L 21/67248; H01L 21/67379; H01L 21/68742; G01J 5/0818
(Continued)

(56) References Cited

U.S. PATENT DOCUMENTS 6,086,245 A      7/2000  Yam
6,151,446 A *   11/2000  Hunter .............. H01L 21/67248
                                                          118/725
(Continued)

FOREIGN PATENT DOCUMENTS

EP          821404 A2     1/1998
JP       2002093890 A     3/2002
KR     20080042531 A     5/2008

OTHER PUBLICATIONS

International Search Report and Written Opinion dated Jun. 2, 2014 for Application No. PCT/US2014/018189.

*Primary Examiner* — Lisa Caputo
*Assistant Examiner* — Philip Cotey
(74) *Attorney, Agent, or Firm* — Patterson + Sheridan, LLP

(57) ABSTRACT

Disclosed are method and apparatus for treating a substrate. The apparatus is a dual-function process chamber that may perform both a material process and a thermal process on a substrate. The chamber has an annular radiant source disposed between a processing location and a transportation location of the chamber. Lift pins have length sufficient to maintain the substrate at the processing location while the substrate support is lowered below the radiant source plane to afford radiant heating of the substrate. One or more lift pins has a light pipe disposed therein to collect radiation emitted or transmitted by the substrate when the lift pin contacts the substrate surface.

15 Claims, 3 Drawing Sheets

(51) Int. Cl.
*G01J 5/00* (2006.01)
*G01J 5/08* (2006.01)

(58) Field of Classification Search
USPC .............................................. 374/121; 269/14
See application file for complete search history.

(56) References Cited

U.S. PATENT DOCUMENTS

| | | | |
|---|---|---|---|
| 6,345,909 B1 | 2/2002 | Yam | |
| 6,353,210 B1* | 3/2002 | Norrbakhsh | C30B 25/16 219/121.43 |
| 6,515,261 B1 | 2/2003 | Smargiassi et al. | |
| 6,575,622 B2* | 6/2003 | Norrbakhsh | C30B 25/16 219/497 |
| 2002/0048311 A1* | 4/2002 | Norrbakhsh | C30B 25/16 374/141 |
| 2002/0121312 A1* | 9/2002 | Lubomirsky | H01L 21/68742 141/4 |
| 2003/0124820 A1 | 7/2003 | Johnsgard et al. | |
| 2006/0086713 A1* | 4/2006 | Hunter | F27B 5/04 219/411 |
| 2009/0120584 A1* | 5/2009 | Lubomirsky | H01L 21/67017 156/345.51 |
| 2010/0294199 A1* | 11/2010 | Tran | C23C 16/4401 118/723 R |
| 2011/0033620 A1* | 2/2011 | Polyak | C23C 16/4586 427/248.1 |

* cited by examiner

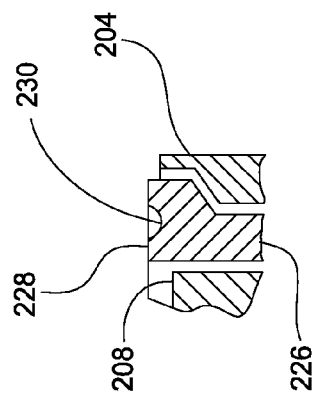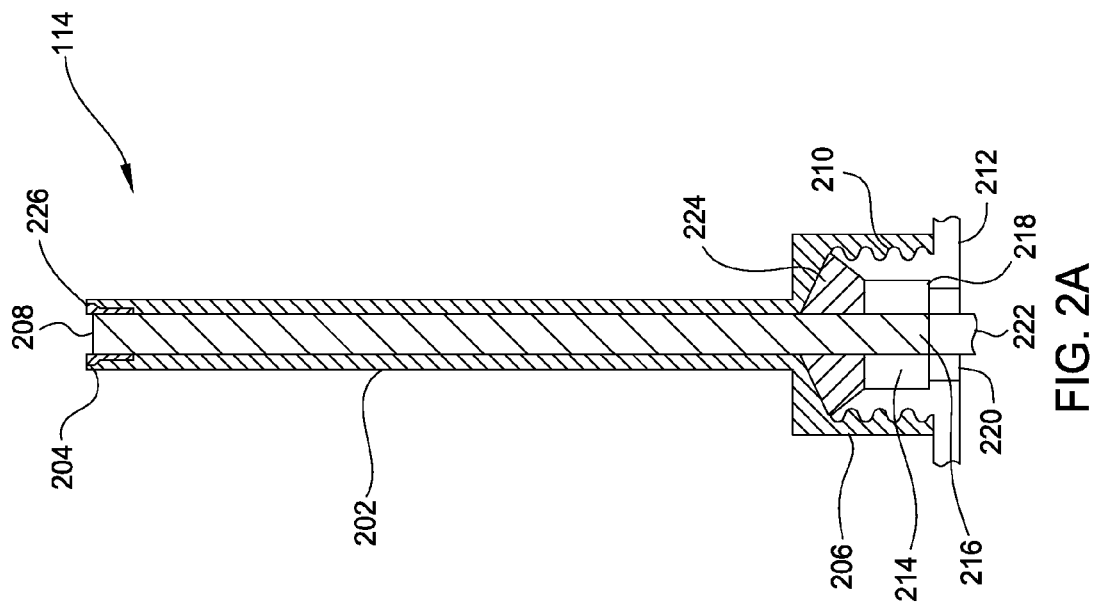

IN-SITU TEMPERATURE MEASUREMENT IN A NOISY ENVIRONMENT

CROSS-REFERENCE TO RELATED APPLICATIONS

This application claims benefit of U.S. Provisional Patent Application Ser. No. 61/789,185, filed Mar. 15, 2013, which is incorporated herein by reference.

FIELD

Embodiments disclosed herein relate to semiconductor processing. More specifically, embodiments disclosed herein relate to apparatus and methods for measuring temperature during thermal processing.

BACKGROUND

Thermal processing is common in semiconductor manufacturing. Semiconductor substrates are often subjected to thermal treatment following a material process such as deposition, implantation, or etching. Temperature of a substrate undergoing a thermal process is often measured. In some such processes, heat sources in the chamber produce a large amount of thermal energy that can overwhelm thermal energy being emitted by the substrate. Thus, there is a continuing need for methods and apparatus for measuring temperature of a substrate during thermal processing.

SUMMARY

Disclosed are method and apparatus for treating a substrate. The apparatus is a dual-function process chamber that may perform both a material process and a thermal process on a substrate. The chamber has an annular radiant source disposed between a processing location and a transportation location of the chamber. Lift pins have length sufficient to maintain the substrate at the processing location while the substrate support is lowered below the radiant source plane to afford radiant heating of the substrate. One or more lift pins has a light pipe disposed therein to collect radiation emitted or transmitted by the substrate when the lift pin contacts the substrate surface.

The light pipe is shielded from thermal noise in the chamber by a tip that contacts a surface of the substrate. The light pipe may be coupled to a thermal sensor by a conduit, such as a fiber optic.

A method of using such a light pipe to detect thermal state of a substrate in a noisy environment may include sensing a radiation wavelength that is transmitted at varying intensities as thermal state of the substrate changes, and sensing a radiation wavelength that is transmitted at intensities independent of thermal state of the substrate and comparing the two signals.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A is a cross-sectional view of a light pipe according to another embodiment.

FIG. 2B is a close-up view of the light pipe of FIG. 2A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
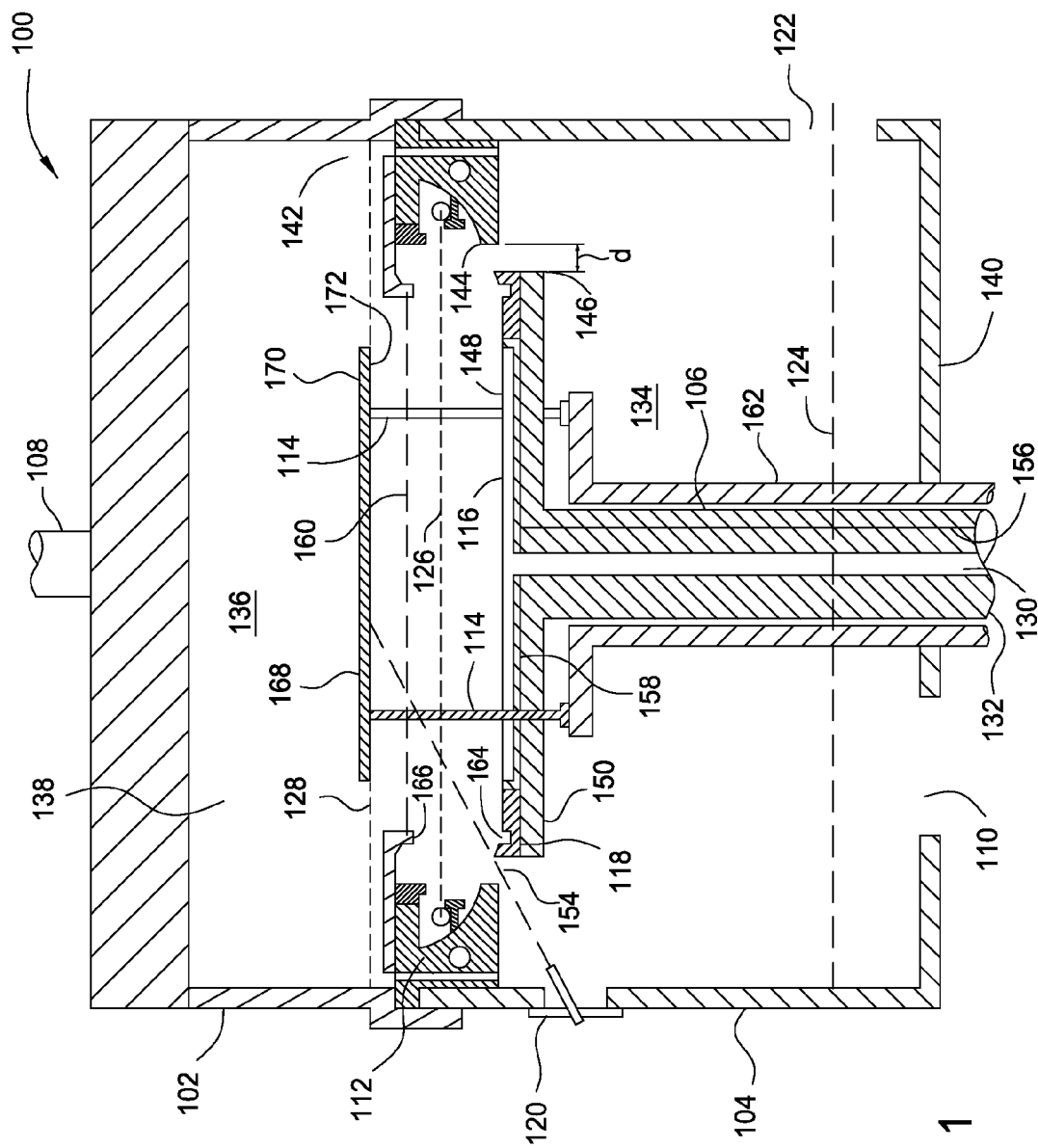
FIG. 1 is a schematic cross-sectional view of a chamber according to one embodiment.

A chamber is configured for deposition of material on a first side of a substrate and irradiation on a second side of the substrate opposite the first side of the substrate. Such a chamber is a dual-function chamber capable of performing both a material process and a thermal process on a substrate without removing the substrate from the chamber, thus eliminating the time needed to transport the substrate from a deposition chamber to an anneal chamber. The chamber has a radiant energy assembly positioned at a peripheral region of the chamber and defining a radiant source plane between a processing location and a transportation location of the chamber, a reflector disposed around the radiant energy assembly, and a gas source disposed above the processing location. FIG. 1 is a schematic cross-sectional view of a chamber 100 according to one embodiment. The chamber 100 has a wall 104 and a lid portion 102 that enclose an interior volume 138 thereof. A substrate support 106 separates the interior volume 138 into an upper volume 136 and a lower volume 134. Process gases are admitted to the upper volume 136 of the chamber through an inlet 108 formed in the lid portion 102, and a substrate disposed on a substrate receiving surface 116 of the substrate support 106 is exposed to the process gases at a processing location 160 of the chamber 100. Processing gases flow across the substrate receiving surface 116 of the substrate support 106, around a peripheral portion thereof, and exit the chamber 100 through a pumping portal 110.

A shaft 132 of the substrate support 106 penetrates a lower wall 140 of the chamber, and includes a conduit 130 that provides fluid communication between a source of cooling gas (not shown) and a substrate receiving surface 116. The substrate support 106 is actuated vertically to move a substrate disposed on the substrate receiving surface 116 of the substrate support 106 between the processing location 160 and a transportation location 124 of the chamber. The transportation location 124 defines a location of the substrate at which a substrate handling apparatus (not shown) may manipulate a substrate through a portal 122.

A radiant source assembly 112 is disposed at a periphery 142 of the chamber 100 and defines a radiant source plane 126 that is between the processing location 160 and the transportation location 124. A plurality of lift pins 114 are disposed through the substrate receiving surface 116 of the substrate support 106 and are actuated to maintain a substrate near the processing location 160 while the substrate support 106 retracts below the radiant source plane 126. The substrate is thereby exposed to radiation from the radiant source assembly 112. In one aspect, the substrate may be positioned at a thermal processing location 128 different from the processing location 160, which may be a material processing location, by actuating the lift pins.

The radiant source assembly 112 typically surrounds the substrate support 106. An inner extent 144 of the radiant source assembly 112 is located a radial distance "d" from an outer extent 146 of the substrate support 106. The distance "d" is chosen to produce a selected irradiance of a substrate located at or near the processing location 160. By varying the distance "d" between the radiant source assembly 112 and the outer extent 146 of the substrate support 106, amount and intensity of radiation affecting the substrate may be adjusted. The distance "d" is typically substantially constant at all points of the radiant source assembly 112, and is between about 0.001 cm (i.e. 10 µm) and about 5 cm, for example between about 1 cm and about 3 cm, for a chamber configured to process 300 mm wafers. The distance "d" may also be different at different locations in the chamber 100, according to any desired design. For example, the distance "d" may be different at different points around the extent of the radiant energy assembly 112.

A shield ring 118, which may be metal or ceramic, is disposed around an edge 148 of the substrate receiving surface 116. The shield ring 118 substantially covers an outer extent 146 of the substrate support 106 to prevent deposition thereon. The shield ring 118 rests on a ledge 150 formed in the outer extent 146 of the substrate receiving surface 116. In most cases, a substrate disposed on the substrate receiving surface 116 contacts the shield ring 118. In alternate embodiments, the substrate may have an outer radius less than an inner radius of the shield ring 118, such that the substrate does not contact the shield ring 118.

In operation, the substrate support 106 moves vertically within the chamber 100, extending and retracting to various positions at different stages of processing. Fully retracted to a transportation location, the substrate receiving surface 116 is positioned near the transportation location 124 to allow a substrate handling mechanism (not shown) to deposit and retrieve substrates. The lift pins 114 are extended by actuator 162 to lift the substrate above the substrate receiving surface 116. Actuator 162 moves independently of substrate support 106 by virtue of a motor (not shown) coupled to the actuator 162. As the substrate support 106 rises from the transportation position, the lift pins 114 are retracted, so the substrate receiving surface 116 engages the substrate.

The substrate receiving surface 116 may incorporate an electrostatic chuck, which is typically a conductor 158 disposed in an insulating substrate receiving surface 116. The conductor 158 may be a plate, a wire mesh, or a single-path wire circuitously routed through the substrate receiving surface 116. Power is typically coupled to the conductor 158 through a conduit 156 disposed through the shaft 132 of the substrate support. As the substrate receiving surface 116 engages the substrate, the electrostatic chuck may be energized to immobilize the substrate on the substrate support 106. Cooling gas may also be established through the conduit 130 at that time.

The substrate support 106, with the substrate positioned thereon, moves the substrate toward the processing locations 128 and 160. The substrate support 106, with the shield ring 118 resting on the ledge 150, passes by the radiant source assembly 112 as the substrate support 106 rises toward the processing location 160. When the substrate receiving surface 116 reaches the processing location 160, the substrate may be subjected to a material process, such as deposition, implant, or etch. The shield ring 118 may have a notch 164 for engaging a cover ring 166, which may be metal or ceramic, extending outward from the shield ring 118 toward the lid portion 102. The cover ring 166 and notch 164 improve the function of the shield ring 118 by controlling gas flow from the upper volume 136 past the cover ring 166 into the lower volume 134. The notch 164 and barrier 166 are optional. As the substrate support 106 moves toward the processing locations 160 and 128, the shield ring 118 engages the cover ring 166. As the substrate support 106 moves toward the processing location 128 from the processing location 160, the cover ring moves with the shield ring 118 and the substrate support 106

In some embodiments, an edge support may be provided that extends inward from the sidewall 104 at a point between the radiant source assembly 112 and the transportation location 124. The edge support (not shown) may be configured to engage the shield ring 118 as the substrate support 106 moves toward the transportation location 124. In such an embodiment, the ledge 150 has an outer radius less than an outer radius of the shield ring 118, such that a portion of the shield ring 118 extends beyond the outer extent 146 of the substrate support 106. Such a configuration enables removing the shield ring 118 from the substrate support 106 to improve access to the substrate receiving surface 116 at the transportation location 124.

After processing at the processing location 160 is complete, the substrate support 106 may be positioned for back-side thermal processing of the substrate. Any chucking of the substrate is disengaged by interrupting power to the conductor 158 (or vacuum to the substrate receiving surface in a vacuum chuck embodiment), the substrate support 106 retracts, and the lift pins 114 are actuated into an extended position. This disengages the substrate from the substrate receiving surface 116, and maintains the substrate at the processing location 160 as the substrate support 106 retracts to the thermal processing position below the radiant source plane 126. The substrate back side is thereby exposed to radiation from the radiant source assembly 112. If desired, the substrate may be moved to a thermal processing location 128 different from the processing location 160 by actuating the lift pins. In such embodiments, the processing location 160 may be a material processing location. It should be noted that a thermal processing location may be above or below the material processing location, as desired depending on the energy exposure needs of specific embodiments. A substrate 168 is shown in FIG. 1 in a thermal processing position.

During thermal processing, the radiant source assembly 112 is powered, and energy radiates from the radiant source assembly 112 toward the substrate 168. The "back side" of the substrate 168, meaning the substrate surface 172 opposite the surface 170 on which a material process was performed, is irradiated in this fashion. Besides providing an integrated material and thermal processing chamber, irradiating the back side 172 of the substrate 168 in this fashion may improve energy efficiency of the thermal process by irradiating a less reflective surface of the substrate 168. In some embodiments, the material process performed on the substrate 168 forms a reflective layer or partial layer on the surface 170 that reduces energy absorption. Irradiating the back side 172 avoids the increased reflectivity. Moreover, the reflectivity of the surface 170 may reflect radiation from the radiant source assembly 112 that travels through the substrate 168 back through the substrate 168 for further efficiency improvement.

In some embodiments, position of the substrate 168 during thermal processing may be modulated to improve uniformity of radiation on the substrate 168. The substrate 168 may be moved further up or down from the thermal processing location 128 cyclically by actuating the lift pins 114 to move any non-uniformities in the radiation pattern to various locations on the back side 172, thus reducing the impact of the non-uniformity and/or substrate bending on substrate processing. Maximum deviation of the back side 172 from the thermal processing location 128 may be expressed as a ratio to substrate thickness. The elevation ratio may vary between about 0.1 and about 100 substrate thicknesses.

When the substrate support 106 is at a thermal processing location, as shown in FIG. 1, a thermal sensor 120 senses a thermal condition of the substrate 168, positioned above the substrate receiving surface 116 on extended lift pins 114, by line-of-sight through a gap 154 between the radiant source assembly 112 and the shield ring 118. In embodiments omitting the shield ring 118, the gap 154 will be between the radiant source assembly 112 and the outer extent 146 of the substrate support 106. The thermal processing location may therefore be defined by the desired gap 154 between the radiant source assembly 112 and the shield ring 118 or the outer extent 146 of the substrate support 106 and the inner extent 144 of the radiant source assembly 112.

After thermal processing is complete, the substrate is typically re-engaged with the substrate receiving surface 116 by retracting the lift pins 114. Chucking may be re-applied, and cooling gas re-established to cool the substrate. The substrate support 106 may then be moved into position for further processing, if desired, or back to the transportation location for retrieval of the substrate. When the substrate support 106 is positioned at the transportation location, access to the substrate is provided by extending the lift pins 114 so that a robot blade may be inserted between the substrate and the substrate receiving surface 116.

The substrate receiving surface 116 may be reflective. A dielectric mirror surface is provided in one embodiment. In other embodiments, a reflective metal, such as silver, is applied over a ceramic material, or under a transparent material. The reflective material may be extended into the fluid flow recesses in a conformal fashion. For example a reflective liner may be applied to the fluid flow recesses, if desired. Any known conformal process may be used to form a conformal reflective surface, if desired. In another embodiment, the reflective material may be applied only to the fluid flow recesses, for example by depositing the reflective material conformally and removing the reflective material from the flat surfaces between the recesses, either by physical means such as polishing or by chemical means such as etching.

A reflective substrate receiving surface 116 may be configured to selectively reflect radiation likely to be absorbed by the substrate 168. For example, in one embodiment, a dielectric mirror configured to reflect radiation having a wavelength between about 0.2 µm and about 1.0 µm may be useful. Such a dielectric mirror may be fashioned by forming alternating layers having different refractive indices on the substrate receiving surface 116.

It should be noted that the substrate need not be positioned at the same location for material (i.e. deposition or implant) and thermal processing. In the foregoing description, it is suggested that the processing location 160 is the same during material and thermal processing, but it is not required to be so. For example, a thermal processing location may be different from a material processing location. The substrate may be raised or lowered from a material processing location to a thermal processing location. The location of the thermal processing location with respect to the material processing location generally depends on design of the radiant source and the needs of the material process.

The chamber 100 may be a PVD chamber in one embodiment. In such an embodiment, the lid portion 102 of the chamber 100 will include a sputtering target, magnetron, and gas feed system as is known in the art. In an alternate embodiment, the chamber 100 may be a CVD chamber, PECVD chamber, or etch chamber, with a showerhead or showerhead electrode disposed in the lid portion 102 as is known in the art. In another embodiment, the chamber 100 may be a P3i chamber with an inductive plasma source disposed in, or coupled to, the lid portion 102, as is known in the art. A radiant source assembly such as the radiant source assembly 112 may be used in any processing chamber desirous of integrated thermal processing.

The chamber 100 described above in connection with FIGS. 1-2B is a dual-function chamber that performs a material process and a thermal process on a substrate in a single chamber. Such a dual-function chamber is useful for processes that feature a material process followed by a thermal process. Such processes include, but are not limited to, metal deposition and reflow, silicidation, deposition (CVD, ALD, PECVD, epitaxy) and anneal, implant and anneal, and plasma nitridation and reoxidation. Such processes may be performed in a single chamber by coupling a peripheral radiation source, substantially as described above, to a chamber that performs the material process.

Measurement of substrate temperature is accomplished through non-contact means by disposing a light pipe in one lift pin and coupling the light pipe to a thermal radiation sensor, such as a pyrometer. FIG. 2A is a detailed view of a lift pin 114, so configured. The lift pin 114 has a body 202 with a tip 204 and a base 206. A light pipe 208 is disposed within the body 202 of the lift pin 114. The base 206 may have a threaded coupling 210 that couples to a threaded mount 212. The threaded mount 212 may be attached to the actuator 162 of FIG. 1. The light pipe has a base end 216 that extends into the base 206 of the lift pin 114 and into the mount 212. A face seal 214 is disposed about the base end 216 of the light pipe and abutting a shoulder 218 of an opening 220 in the mount 212. A conduit 222, such as a fiber optic cable, for example a 200 µm fiber bundle, couples to the light pipe 208 at the base end 216 thereof through the opening 220. A crush seal 224 is positioned about the base end 216 of the light pipe 208 adjacent to the face seal 214. The crush seal 224 is positioned to be compressed by the base 206 as the lift pin 114 is attached to the mount 212. Compression of the crush seal 224 applies force on the face seal 214, urging the face seal 214 against the shoulder 218 to seal the opening 220. Compression of the crush seal 224 also urges the crush seal 224 against the light pipe 208 to provide a radial seal around the light pipe 208. The face seal 214 may be a dual seal with two seal members between the crush seal 224 and the shoulder 218.

The tip 204 of the lift pin 114 has a swivel coupling 226 disposed between the tip 204 of the lift pin 114 and the light pipe 208. FIG. 2B is a detailed view of the swivel coupling 226 disposed inside the tip 204. The swivel coupling 226 extends beyond the tip 204 and the light pipe 208 to prevent contact between a substrate and either the tip 204 or the light pipe 208. The swivel coupling 226 is free to rotate within the tip 204 so that a contact surface 228 of the swivel coupling 226 may remain in full contact with the substrate surface along the entire extent of the contact surface 228 in the event the substrate surface rotates or bows. The contact surface 228 prevents environmental thermal radiation present in the chamber from entering the light pipe 208, so that substantially the only radiation received by the light pipe 208 is radiation emitted by the substrate.

The contact surface 228 of the swivel coupling 226 is contoured to provide a light trap. A groove 230 formed in the contact surface 228 reduces parallelism between the contact surface 228 of the swivel coupling 226 and the substrate surface, which reduces reflective transmission of light through the interface between the contact surface 228 and the substrate surface. The groove 230 provides a non-parallel portion of the contact surface 228 to disturb reflective propagation of light through the interface, reducing intrusion of radiation around the swivel coupling 226 and into the light pipe 208.

The lift pin body 202 may be a thermally conductive material to provide a heat shield for the light pipe 208 disposed inside. A metal, such as copper, may be used.

Figure 3:
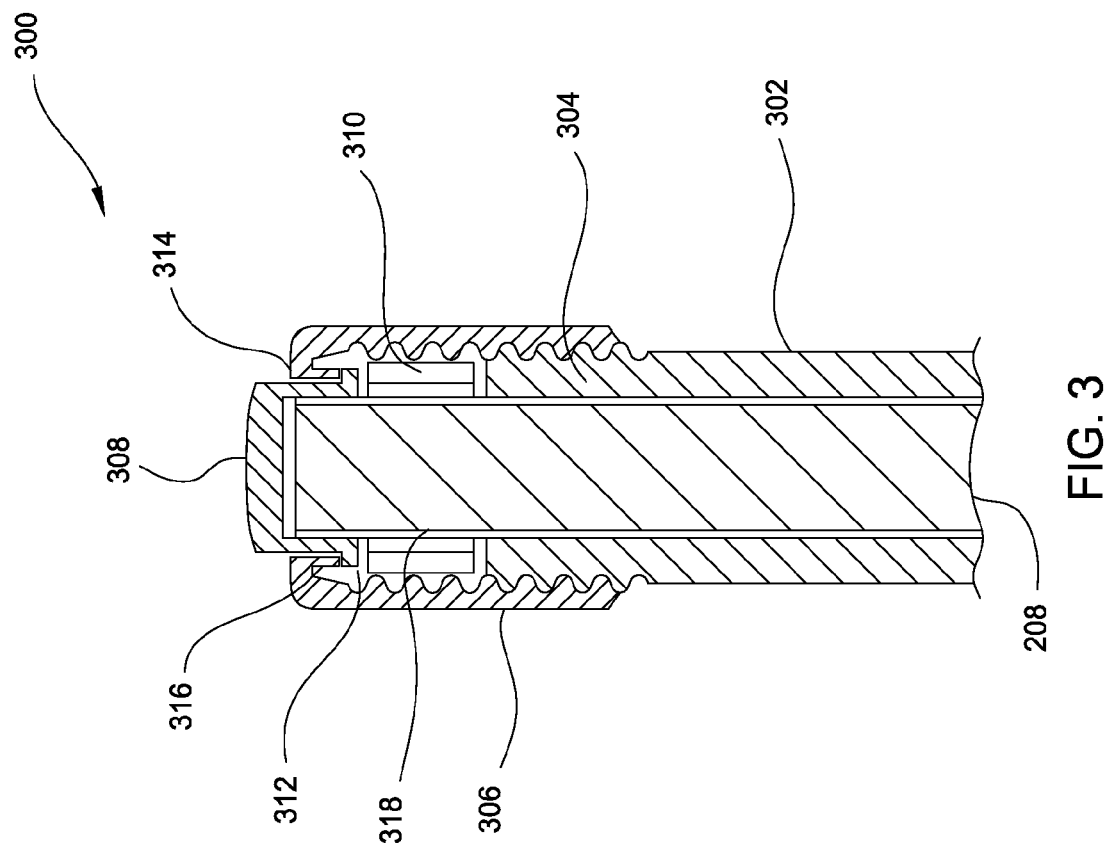
FIG. 3 is a cross-sectional view of a light pipe according to another embodiment.

FIG. 3 is a cross-sectional view of a tip 300 of a lift pin 302 for use in the chamber 100 according to another embodiment. The lift pin 302 has the light pipe 208 disposed within. The tip 300 is a "blind" tip because the end of the light pipe 208 is covered by a cover 308 that reduces thermal noise around the light pipe 208. The cover 308 has a ledge 312 that protrudes radially outward from the light pipe 208 and engages an inward extension 314 of a threaded clamp 306. The threads of the threaded clamp 306 in turn engage a threaded end 304 of the lift pin 302. A compression ring 316 may be used between the ledge 312 and the extension 314. An insulator 310 is disposed around a portion 318 of the light pipe 208 that protrudes above the end of the lift pin 302. The insulator may be a material that has low thermal conductivity, such as quartz, to prevent intrusion of thermal noise into the light pipe through the side. The cover 308 is typically a thermally conductive material, for example a metal like tungsten, to facilitate the light pipe 208 absorbing thermal energy from a substrate in contact with the cover 308. The lift pin 302 generally has the same base construction as the lift pin of FIG. 2A, where the light pipe 208 is optically coupled to the conduit 222 for transmission of a signal to a thermal sensor.

A chamber such as the chamber 100, with a lift pin 114 configured to sense thermal emissions from a substrate may be used to sense a substrate temperature in an environment with high levels of thermal noise. A first signal may be ascertained that contains information about the thermal state of the substrate and thermal noise from the environment. A second signal may also be ascertained that contains only, or substantially, thermal noise from the environment. Comparing the first signal and the second signal reveals a composite signal that contains information about the thermal state of the substrate with very little noise. In some embodiments, the first signal is a transmissivity signal that varies inversely with temperature. In embodiments that feature relatively opaque substrates where little radiation is transmitted by the substrate into the light pipe, thermal noise from the chamber is relatively low, and direct substrate emissions may be used to sense substrate temperatures at low levels such as 200° C. Where the substrate is more transparent, thermal noise from the chamber is transmitted by the substrate into the light pipe and direct substrate emissions, which are at similar wavelengths, may be overwhelmed. In such embodiments, wavelengths that are only emitted by the chamber, and not by the substrate, may be used as a measure of environmental thermal noise. It is known that transmissivity of materials such as silicon declines at some wavelengths, particularly longer wavelengths, as temperature rises, so transmissivity of the substrate may be monitored using one wavelength while thermal noise is monitored at a second wavelength at which the substrate is transparent at all temperatures, such as a shorter wavelength, and the two signals may be compared to determine temperature of the substrate.

In one embodiment, a lift pin configured with a light pipe as described herein, is used to collect thermal radiation at two different wavelengths, one wavelength selected based on a change in transmissivity of the substrate with temperature at that wavelength, and another wavelength characteristic of thermal noise in the chamber that is transmitted at all temperatures of interest. The first wavelength may be a long wavelength, such as a wavelength above about 1200 nm, for example about 1280 nm or 1550 nm, and the second wavelength may be a shorter wavelength, such as less than about 1100 nm, for example about 920 nm. In such an embodiment, the substrate is transparent to the second wavelength at all temperatures of interest while transmission of the first wavelength varies with temperature. The intensity of radiation detected at the second wavelength is used as an indicator of radiation levels in the chamber, and is subtracted from the intensity of radiation detected at the first wavelength using known emission characteristics of the radiation source. The resulting signal indicates radiation transmitted by the substrate. The transmitted intensity may be correlated to substrate temperature, so that as the transmitted intensity changes, temperature may be determined. In such an embodiment, the temperature will be inversely related to the intensity of the radiation signal.

While the foregoing is directed to embodiments of the invention, other and further embodiments of the invention may be devised without departing from the basic scope thereof.

What is claimed is:

1. A lift pin for supporting a substrate in a semiconductor processing chamber, the lift pin comprising a light pipe and a swivel coupling disposed in an end of the lift pin, wherein the swivel coupling has a contoured substrate contact surface.

2. The lift pin of claim 1, wherein the substrate contact surface forms a light trap.

3. The lift pin of claim 2, wherein the light trap comprises a groove in the substrate contact surface.

4. The lift pin of claim 3, wherein the swivel coupling is disposed between the light pipe and a tip of the lift pin.

5. The lift pin of claim 4, wherein the swivel coupling protrudes beyond the light pipe and the tip.

6. The lift pin of claim 4, wherein the swivel coupling is rotatable.

7. The lift pin of claim 2, wherein the light trap comprises a tortuous surface of the swivel coupling.

8. The lift pin of claim 1, wherein the swivel coupling comprises a thermally conductive material.

9. The lift pin of claim 8, wherein the thermally conductive material is a metal.

10. The lift pin of claim 1, wherein the substrate contact surface is contoured with a groove.

11. The lift pin of claim 10, wherein the groove reduces parallelism between the substrate contact surface and a surface of the substrate.

12. The lift pin of claim 10, wherein the groove reduces reflective transmission of light through an interface between the substrate contact surface and a surface of the substrate.

13. The lift pin of claim 1, wherein the substrate contact surface has a non-parallel portion relative to a surface of the substrate.

14. The lift pin of claim 13, wherein the non-parallel portion disturbs reflective propagation of light through an interface between the substrate contact surface and the surface of the substrate.

15. The lift pin of claim 13, wherein the non-parallel portion reduces intrusion of radiation around the swivel coupling and into the light pipe.

\* \* \* \* \*